(12) United States Patent
Kato et al.

(10) Patent No.: US 6,262,641 B1
(45) Date of Patent: Jul. 17, 2001

(54) FREQUENCY MULTIPLIER, DIELECTRIC TRANSMISSION LINE DEVICE AND RADIO DEVICE

(75) Inventors: Takatoshi Kato, Mino; Koichi Sakamoto, Otsu; Atsushi Saitoh, Muko, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/326,202

(22) Filed: Jun. 4, 1999

(30) Foreign Application Priority Data

Jun. 8, 1998 (JP) .................................................. 10-159026

(51) Int. Cl.$^7$ ................................. H03H 7/38; H01P 1/00

(52) U.S. Cl. ............................................. 333/218; 333/33

(58) Field of Search ..................................... 333/218, 239, 333/248, 33; 363/158, 159; 455/323; 327/119

(56) References Cited

U.S. PATENT DOCUMENTS 5,886,595 * 3/1999 Von Stein ............................ 333/218
6,031,433 * 2/2000 Tanizaki et al. ....................... 333/26

FOREIGN PATENT DOCUMENTS 9-083216   3/1997 (JP) .

OTHER PUBLICATIONS

Patent Abstracts of Japan, vol. 1997, No. 07, Jul. 31, 1997, & JP 09 083216 A (Mitsubishi Electric Corp; Yoneyama Tsutomu), Mar. 28, 1997, abstract, p. 8, col. 1, line 13–line 42; Figure 31, p. 9, col. 1, line 1–line 10.

Iyama et al., "Second Harmonic Reflection Type High–Gain FET Frequency Doubler Operating in K–Band", Intl. Microwave Symposium, New York, Jun. 13–15, 1989, pp. 1291–1294, p. 1291, col. 2 lines 1–10, Fig. 1.

* cited by examiner

Primary Examiner—Robert Pascal
Assistant Examiner—Kimberly E Glenn
(74) Attorney, Agent, or Firm—Ostrolenk, Faber, Gerb & Soffen, LLP

(57) ABSTRACT

In a dielectric transmission line device and a radio device using a dielectric transmission line device, an output matching circuit is constructed in a simplified fashion and an output signal of a frequency multiplier is output via a dielectric transmission line. The frequency multiplier is constructed in a small form in the dielectric transmission line device so as to obtain a dielectric transmission line device with a small total size and also obtain a small-sized high-efficiency radio device using such a dielectric transmission line device as a transmission line for transmitting a transmission signal. An input matching circuit is disposed between an input terminal and an FET for generating a harmonic. An open-ended transmission line is also provided which is coupled with an electromagnetic field of a dielectric transmission line in the form of a dielectric strip.

17 Claims, 4 Drawing Sheets

FREQUENCY MULTIPLIER, DIELECTRIC TRANSMISSION LINE DEVICE AND RADIO DEVICE

BACKGROUND OF THE INVENTION

1. Field of the Invention

The present invention relates to a frequency multiplier, a dielectric transmission line device, and a radio device, for use in a high frequency range such as a millimeter wave or sub-millimeter wave range.

2. Description of the Related Art

A signal source having a sufficiently high capability of directly generating a signal in the millimeter wave or sub-millimeter wave range is not known in the art. Therefore, in the millimeter wave or sub-millimeter wave range, frequency multipliers are widely used to generate a signal at a desired frequency by multiplying the frequency of an input signal by an integral factor. Frequency multipliers are generally realized using non-linearity in the current vs. voltage characteristic of a device such as a Schottky barrier diode, step recovery diode, bipolar transistor, FET, etc.

FIG. 6 illustrates a conventional frequency multiplier. As shown in FIG. 6, the frequency multiplier includes an FET for generating a multiplied frequency, an input matching circuit disposed between an input terminal and the FET, and an output matching circuit disposed between the FET and an output terminal. The frequency multiplier is designed taking into account both the fundamental-frequency signal input via the input terminal and the multiplied-frequency signal output via the output terminal. For example, the output matching circuit is designed such that the signal at the fundamental frequency is absolutely reflected but, at a desired harmonic frequency, a signal having a maximum power is transferred to the output terminal. In FIG. 6, a fundamental frequency reflecting stub reflects the fundamental frequency and a multiplied frequency matching stub provides matching with the FET so that the multiplied frequency is output in a most efficient manner.

In the conventional frequency multiplier, as shown in FIG. 6, input and output matching circuits with a large size and a complicated structure are required to provide matching for both the fundamental frequency and the multiplied frequency. In circuits used in the millimeter or submillimeter wave ranges, a dielectric transmission line such as an NRD (Non-Radiative Dielectric) waveguide is known to be advantageous in that a low transmission loss can be achieved. However, in practice, no frequency multiplier is known which provides an output signal directly through a NRD waveguide.

In order to output a signal via an NRD waveguide, it is required to provide a transmission line transformer between a conventional type frequency multiplier with a microstrip line and the NRD waveguide as shown in FIG. 7. However, when the output matching circuit is constructed in the form of a planar circuit as shown in FIG. 6, a transmission line transformer circuit for providing a connection between the planar circuit and the NRD waveguide is needed to be connected to the output terminal of the frequency multiplier. This causes the frequency multiplier to become greater in total size and more complex in structure.

In view of the above, it is an object of the present invention to provide a frequency multiplier with an output matching circuit having a simplified structure in which an output signal is obtained directly through a dielectric transmission line.

It is another object of the present invention to provide a dielectric transmission line device in which a small-sized frequency multiplier is employed so as to achieve a reduction in the total size.

It is still another object of the present invention to provide a radio device using a dielectric transmission line of the above-described type as a transmission line for transmitting a transmission signal.

SUMMARY OF THE INVENTION

According to an aspect of the invention, there is provided a frequency multiplier including an element for generating a harmonic and an output matching circuit disposed between the above-described element and an output terminal wherein the output matching circuit includes a dielectric transmission line which passes a multiplied frequency and also includes an open-ended transmission line coupled with an electromagnetic field of the dielectric transmission line.

An FET may be employed as the above-described element for generating a harmonic. In this case, the source of the FET is grounded and the gate of the FET is connected to an input matching circuit. This configuration makes it possible to generate a harmonic or a multiplied-frequency signal more efficiently.

The dielectric transmission line may be constructed in the form of a non-radiative dielectric (NRD) waveguide to reduce the transmission loss due to electromagnetic wave radiation. The NRD waveguide may be disposed in close proximity to another transmission line without causing unwanted coupling with that transmission line. This makes it possible to achieve a further reduction in the total size.

The above-described transmission line serving as the output matching circuit may include a part having a width different from the width of the other part of the transmission line wherein the part with the different width has a length one-quarter the wavelength of the multiplied frequency such that the part serves as an impedance transformer. This allows the transmission line to be electromagnetically coupled with the dielectric transmission line with a particular characteristic impedance in a most efficient fashion. It also provides good matching between the transmission line and the harmonic-generating element, such as an FET, thereby making it possible to efficiently output the multiplied-frequency signal.

According to still another aspect of the invention, there is provided a dielectric transmission line device including a frequency multiplier according to any of the above-described aspects of the invention wherein the frequency multiplier is disposed between an oscillator device and a dielectric transmission line. This makes it possible to realize a dielectric transmission line device including a small-sized high-efficiency frequency multiplier.

According to still another aspect of the invention, a small-sized high-efficiency radio device includes a dielectric transmission line device according to the above aspect of the invention as a transmission line for transmitting a transmission signal.

DESCRIPTION OF THE PREFERRED EMBODIMENTS

A first embodiment of a frequency multiplier according to the invention is described below with reference to FIGS. 1 and 2.

Figure 1:
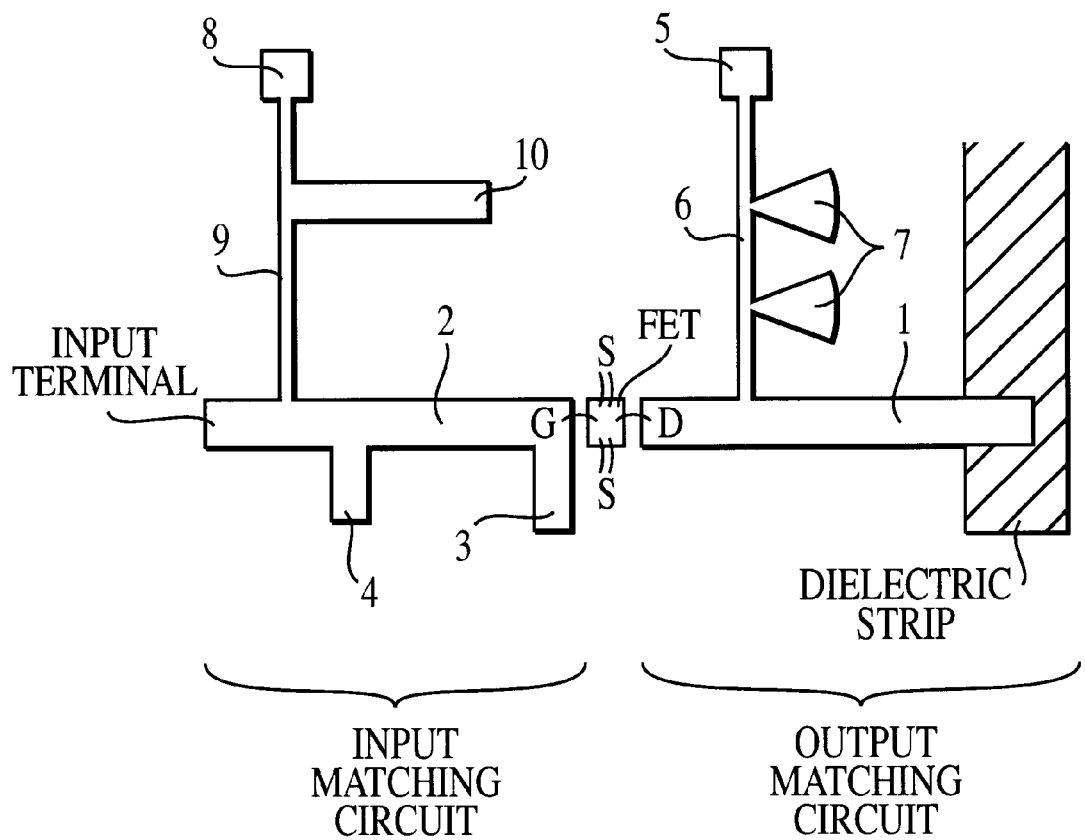
FIG. 1 is a schematic diagram illustrating a first embodiment of a frequency multiplier according to the invention.

FIG. 1 is a schematic diagram illustrating the construction of the frequency multiplier including an input matching circuit, an output matching circuit, and a dielectric strip. FIG. 2 is a schematic diagram illustrating a dielectric transmission line device including the frequency multiplier shown in FIG. 1.

Referring to FIG. 1, the output matching circuit includes a transmission line 1 formed on a circuit substrate. Preferably, the transmission line 1 is constructed in the form of a microstrip line. The transmission line 1 is electrically open at its one end. The open-ended part of the transmission line 1 extends into the inside of the dielectric strip in a direction substantially perpendicular to the longitudinal direction of the dielectric strip. The other end of the transmission line 1 is connected to the drain of an FET via a bonding wire.

The input matching circuit includes a transmission line 2, a multiplied frequency reflecting stub 3, and a fundamental frequency matching stub 4. The transmission line 2 is also preferably constructed in the form of a microstrip line. One end of the transmission line 2 serves as an input terminal and the other end is connected to the gate of the FET via a bonding wire. The multiplied frequency reflecting stub 3 reflects multiplied frequencies (such as a second harmonic of the fundamental frequency) generated by the FET back to the FET without allowing them to propagate toward the input end. The fundamental frequency matching stub 4 provides impedance matching between the transmission line 2 and the FET.

Reference numeral 5 denotes a drain bias terminal. A drain bias line 6 is formed between the drain bias terminal 5 and a particular part of the transmission line 1. Filter stubs 7 are formed at particular parts of the drain bias line 6. The filter stubs 7 prevent the multiplied frequencies from propagating to a drain bias circuit via the drain bias terminal 5. Reference numeral 8 denotes a gate bias terminal. A gate bias line 9 is formed between the gate bias terminal 8 and a particular part of the transmission line 2. A filter stub 10 is formed at a particular part of the gate bias line 9. The filter stub 10 prevents the fundamental frequency input via the input terminal from propagating to a gate bias circuit via the gate bias terminal 8.

Figure 2A:
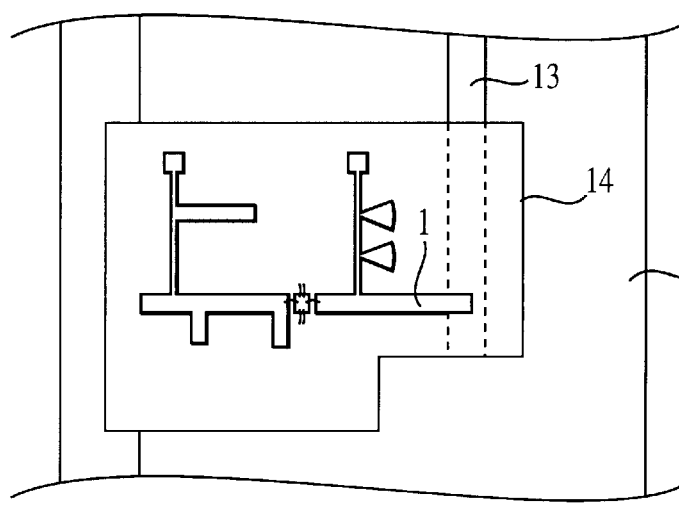
FIGS. 2A–2C are schematic diagrams illustrating a dielectric transmission line device provided with the frequency multiplier shown in FIG. 1.
Figure 2B:
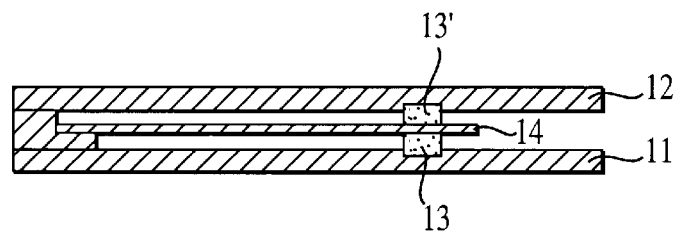
Figure 2C:
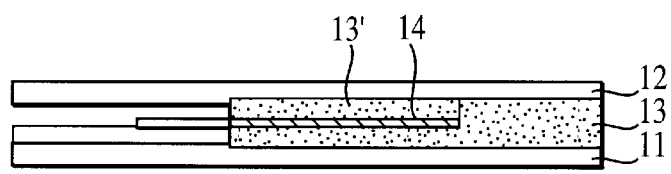

FIG. 2A is a top view illustrating the dielectric transmission line device wherein an upper conductive plate and a part of the dielectric strip are removed. FIG. 2B is a cross-sectional view of the dielectric transmission line device taken along a line passing through the circuit substrate in a direction perpendicular to the dielectric strip. FIG. 2C is a cross-sectional view of the dielectric strip taken along the electromagnetic wave propagation direction. As shown in these figures, an NRD waveguide is formed by disposing a dielectric strip 13 between conductive plates 11 and 12 located a predetermined distance apart from each other. The dielectric strip 13 is thinned, at a part on which a circuit substrate 14 is to be placed, to about one-half the thickness of the other part and a dielectric strip 13' is placed on the thinned part via the circuit substrate 14 such that the circuit substrate 14 is embedded at the substantially center position of the dielectric strip. The circuit including the microstrip lines shown in FIG. 1 is formed on the circuit substrate 14 in such a manner that one end portion of the transmission line 1 intersects the dielectric strip 13 at a predetermined location and further extends into the inside of the dielectric strip 13 in a direction perpendicular to the direction in which electromagnetic waves propagate in the dielectric strip 13. The ground electrode formed on the lower surface of the circuit substrate 14 is partially removed such that there is no ground electrode at least in the part located within the dielectric strip. In the dielectric transmission line device constructed in the above-described manner, the transmission line 1 excites the NRD waveguide such that an LSM-mode wave is generated which is transmitted as a transmission signal along the NRD waveguide. The matching between the microstrip line and the NRD waveguide is optimized by adjusting the distance between the transmission line 1 and the end of the dielectric strip 13 and also adjusting the length of the part of the transmission line 1 embedded into the dielectric strip in the direction perpendicular to the dielectric strip.

Figure 3:
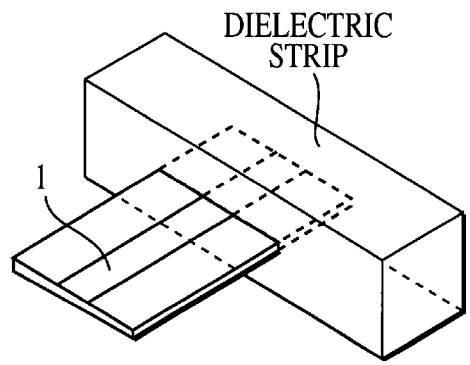
FIG. 3 is a schematic diagram illustrating a transmission line and a dielectric strip used in a frequency multiplier according to a second embodiment of the invention.

Although in the present embodiment, the circuit substrate on which the frequency multiplier is formed is inserted, along the full length of the circuit substrate, into the dielectric strip serving as the NRD waveguide as shown in FIG. 3, only the transmission line 1 serving as the output matching circuit may be inserted into the dielectric strip serving as the NRD waveguide. Furthermore, although in the specific example shown in FIG. 2, the transmission line 1 is constructed in the microstrip line form, the transmission line 1 may also be constructed in the form of a suspended line in which the transmission line 1, formed on the circuit substrate 14 the lower surface of which is covered with no ground electrode, is suspended between the conductive plates 11 and 12.

Figure 4:
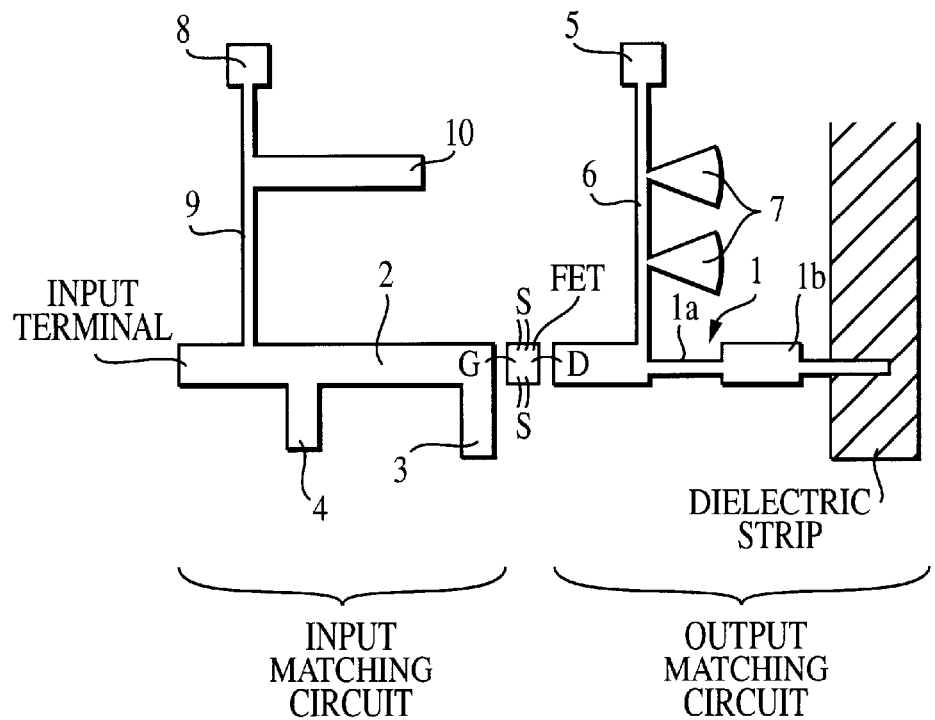
FIG. 4 is a schematic diagram illustrating a third embodiment of a frequency multiplier according to the invention.

FIG. 4 is a schematic diagram illustrating another embodiment of a frequency multiplier according to the invention. This frequency multiplier has a structure similar to that of the frequency multiplier shown in FIG. 1 except for the structure of the transmission line 1 serving as the output matching circuit. In the example shown in FIG. 4, the transmission line 1 includes a part having a width different from the width of the other part wherein that part is formed at a particular position along a length one-quarter the wavelength of the multiplied frequency such that the part serves as an impedance transformer. That is, parts 1a and 1b are formed such that both parts have a length one-quarter the wavelength of the multiplied frequency but they are difference in width. The characteristic impedance of the transmission line 1 is set for example to 50 Ω and the end of the transmission line 1 is coupled with the dielectric strip or the NRD waveguide via a transmission line transformer which is designed such that the transmission line 1 is coupled with the dielectric strip in a most efficient manner. On the other hand, the impedance of the transmission line 1 seen from the FET is converted by the impedance transformer realized by the parts 1a and 1b to a value which matches well with the impedance of the FET. That is, in regard to the multiplied frequency, the parts 1a and 1b behave as quarter-wave lines and thus they act as an impedance transformer which eliminates the impedance mismatching between the drain end of the FET and the transmission line transformer on the NRD waveguide side. On the other hand, the above-described impedance transformer does not make an impedance transformation for the fundamental frequency and thus the fundamental frequency is absolutely reflected by the open end (end of the transmission line 1) of the transmission line transformer on the NRD waveguide side back to the FET. The impedance transformer changes the phase of the reflected fundamental-frequency signal. Taking this fact into consideration, the impedance transformer may be designed such that the reflected fundamental-frequency signal has a phase change which causes the drain end of the FET to become effectively short-circuited for the fundamental frequency thereby maximizing the generation efficiency of the multiplied-frequency signal.

Although in the above example, the multiplied frequency is equal to twice the fundamental frequency, the frequency multiplier may also be constructed such that the output signal has a frequency three or four times the fundamental frequency or even higher frequency by constructing the impedance transformer such that it transmits only a desired harmonic to the NRD waveguide.

Figure 5:
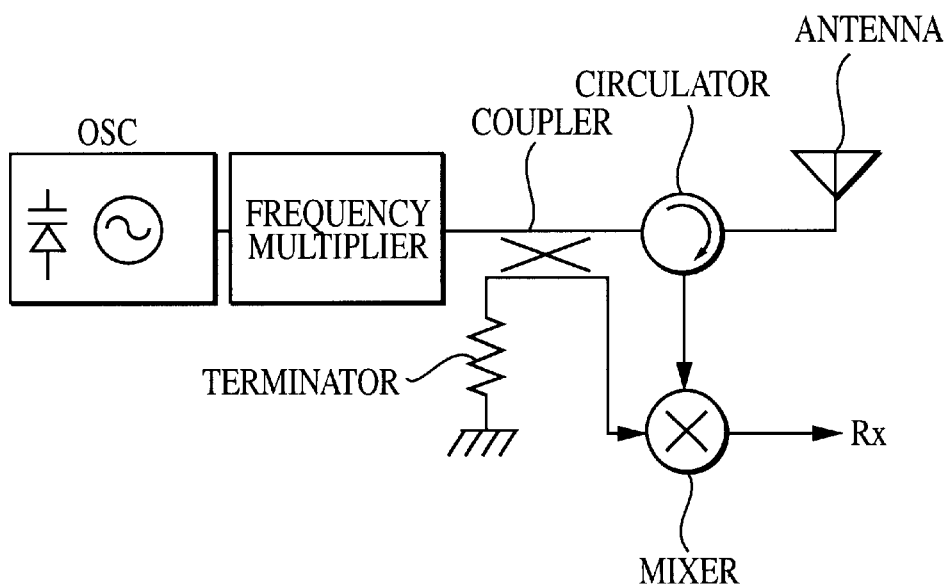
FIG. 5 is a schematic diagram illustrating a radio device.
Figure 6:
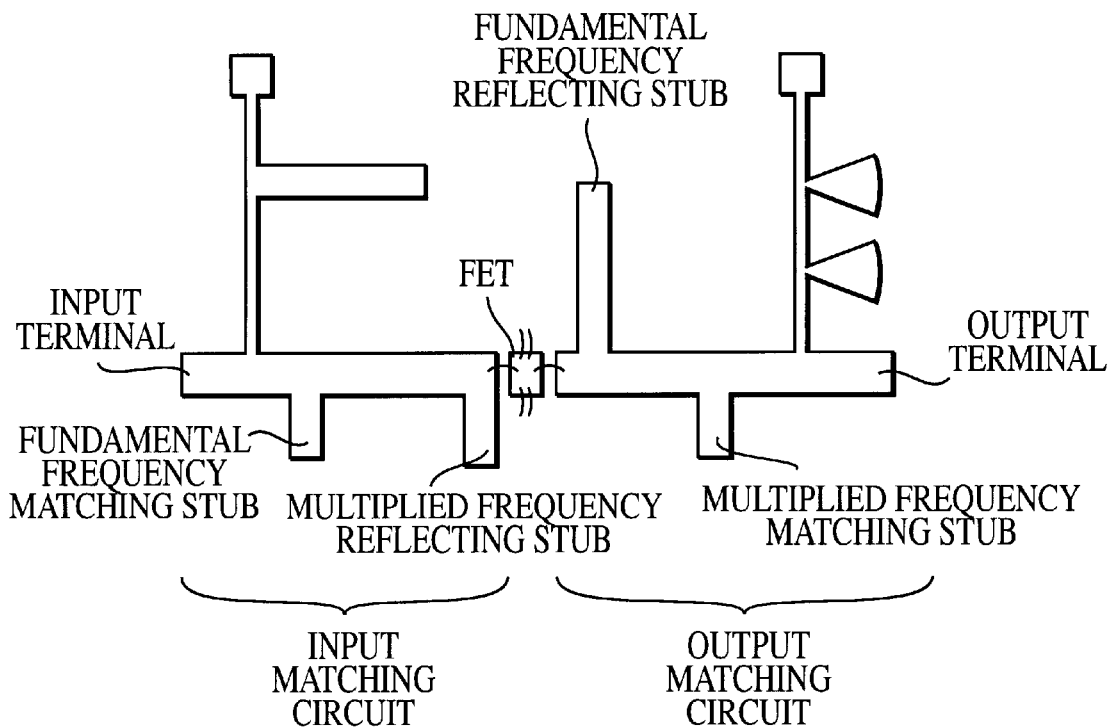
FIG. 6 is a schematic diagram illustrating a conventional frequency multiplier.
Figure 7:
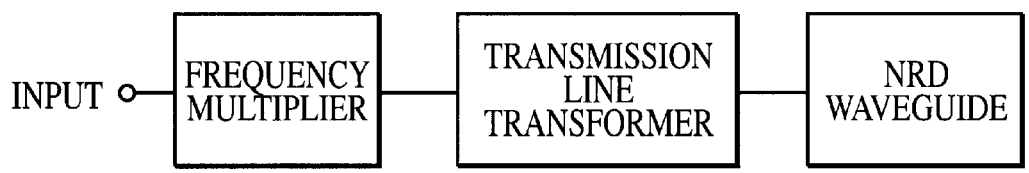
FIG. 7 is a schematic diagram illustrating a frequency multiplier whose output is provided through an NRD waveguide.

FIG. 5 illustrates an example of a radio device. In FIG. 5, an oscillator OSC is constructed for example with a Gunn diode and a varactor diode such that it serves as a voltage controlled oscillator whose output signal is supplied to a microstrip line. The radio device includes a frequency multiplier constructed in the above-described manner. The output of the frequency multiplier is provided through an NRD waveguide including a circulator through which a transmission signal is output to an antenna (primary radiator). The primary radiator is formed for example of a dielectric resonator such that the antenna is formed by this dielectric resonator and a dielectric lens. A signal received by the antenna is applied to a mixer via the circulator. A coupler in the form of an NRD waveguide is disposed between the output end of the frequency multiplier and the circulator such that a Lo (local) signal is applied the mixer. The mixer mixes the Lo signal and the reception signal so that a harmonic is generated using non-linearity of a Schottky diode or a similar device thereby outputting a component having a frequency equal to the difference between the transmission signal and the reception signal. In this radio device, since the part from the output of the frequency multiplier to the output of the mixer is realized using the NRD waveguide, the radio device can be constructed in a small form and a low loss can be achieved.

What is claimed is:

1. A frequency multiplier comprising:
   an element for generating a harmonic frequency;
   an input matching circuit disposed between said element and an input terminal, said input matching circuit serving to pass a fundamental frequency and reflect said harmonic frequency; and
   an output matching circuit disposed between said element and an output terminal, said output matching circuit serving to reflect the fundamental frequency and pass the harmonic frequency,
   wherein said output matching circuit includes a dielectric transmission line which passes the harmonic frequency and also includes another transmission line, said other transmission line having one end which is electrically open and said other transmission line being coupled with an electromagnetic field of the dielectric transmission line.

2. A frequency multiplier according to claim 1, wherein said element is an FET and wherein the source of said FET is grounded, the gate of said FET is connected to said input matching circuit, and the drain of said FET is connected to said output matching circuit.

3. A frequency multiplier according to claim 1, wherein said dielectric transmission line is a non-radiative dielectric waveguide.

4. A frequency multiplier according to any one of claims 1, 2, and 3, wherein said other transmission line includes an impedance transformer comprising a part of said other transmission line having a width different from the width of a remaining part of said other transmission line, said part with said different width having a length which is one-quarter the wavelength of the harmonic frequency, such that said part with said different width serves as an impedance transformer.

5. A dielectric transmission line device comprising:
   a frequency multiplier which includes:
   an element for generating a harmonic frequency;
   an input matching circuit disposed between said element and an input terminal, said input matching circuit serving to pass a fundamental frequency and reflect said harmonic frequency; and
   an output matching circuit disposed between said element and an output terminal, said output matching circuit service to reflect the fundamental frequency and pass the harmonic frequency,
   wherein said output matching circuit includes a dielectric transmission line which passes the harmonic frequency and also includes another transmission line, said other transmission line having one end which is electrically open and said other transmission line being coupled with an electromagnetic field of the dielectric transmission line;
   an oscillator device connected to said input terminal; and
   a dielectric transmission line connected to said output terminal.

6. A dielectric transmission line device according to claim 5, wherein said element is an FET and wherein the source of said FET is grounded, the gate of said FET is connected to said input matching circuit, and the drain of said FET is connected to said output matching circuit.

7. A dielectric transmission line device according to claim 5, wherein said dielectric transmission line is a non-radiative dielectric waveguide.

8. A dielectric transmission line device according to claim 5, wherein said other transmission line includes an impedance transformer comprising a part of said other transmission line having a width different from the width of a remaining part of said other transmission line, said part with said different width having a length which is one-quarter the wavelength of the harmonic frequency, such that said part with said different width serves as an impedance transformer.

9. A radio device comprising:
   a frequency multiplier which includes:
   an element for generating a harmonic frequency;
   an input matching circuit disposed between said element and an input terminal, said input matching circuit serving to pass a fundamental frequency and reflect said harmonic frequency; and
   an output matching circuit disposed between said element and an output terminal, said output matching circuit service to reflect the fundamental frequency and pass the harmonic frequency, wherein said output matching circuit includes a dielectric transmission line which passes the harmonic frequency and also includes another transmission line, said other transmission line having one end which is electrically open and said other transmission line being coupled with an electromagnetic field of the dielectric transmission line;

an oscillator device connected to said input terminal;

a dielectric transmission line connected to said output terminal for transmitting a transmission signal; and an antenna-sharing device for transferring said transmission signal to an antenna terminal, and for transferring a received signal from said antenna terminal to a receiving circuit.

10. A radio device according to claim 9, further comprising a receiving circuit connected to said antenna-sharing device for receiving said received signal.

11. A radio device according to claim 10, further comprising an antenna connected to said antenna terminal.

12. A radio device according to claim 10, wherein said element is an FET and wherein the source of said FET is grounded, the gate of said FET is connected to said input matching circuit, and the drain of said FET is connected to said output matching circuit.

13. A radio device according to claim 10, wherein said dielectric transmission line is a non-radiative dielectric waveguide.

14. A radio device according to claim 10, wherein said other transmission line includes an impedance transformer comprising a part of said other transmission line having a width different from the width of a remaining part of said other transmission line, said part with said different width having a length which is one-quarter the wavelength of the harmonic frequency, such that said part with said different width serves as an impedance transformer.

15. A radio device according to claim 9, wherein said element is an FET and wherein the source of said FET is grounded, the gate of said FET is connected to said input matching circuit, and the drain of said FET is connected to said output matching circuit.

16. A radio device according to claim 9, wherein said dielectric transmission line is a non-radiative dielectric waveguide.

17. A radio device according to claim 9, wherein said other transmission line includes an impedance transformer comprising a part of said other transmission line having a width different from the width of a remaining part of said other transmission line, said part with said different width having a length which is one-quarter the wavelength of the harmonic frequency, such that said part with said different width serves as an impedance transformer.

* * * * *